(12) United States Patent
Kan et al.

(10) Patent No.: US 12,433,032 B2
(45) Date of Patent: Sep. 30, 2025

(54) SEMICONDUCTOR STRUCTURE INCLUDING BOUNDARY HEADER CELL AND METHOD FOR MANUFACTURING THE SAME

(71) Applicant: TAIWAN SEMICONDUCTOR MANUFACTURING COMPANY LTD., Hsinchu (TW)

(72) Inventors: Hao-Tien Kan, New Taipei (TW); Yan-Shen You, Taoyuan (TW); Chin-Shen Lin, Taipei (TW); Kuo-Nan Yang, Hsinchu (TW); Chung-Hsing Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 812 days.

(21) Appl. No.: 17/672,010

(22) Filed: Feb. 15, 2022

(65) Prior Publication Data
US 2023/0260984 A1    Aug. 17, 2023

(51) Int. Cl.
| | |
|---|---|
| H10D 89/10 | (2025.01) |
| H10D 84/85 | (2025.01) |
| G06F 30/30 | (2020.01) |
| G11C 5/14 | (2006.01) |
| H03K 19/00 | (2006.01) |
| H10B 10/00 | (2023.01) |
| H10B 12/00 | (2023.01) |

(52) U.S. Cl.
CPC ........... *H10D 89/10* (2025.01); *H10D 84/854* (2025.01); *G06F 30/30* (2020.01); *G11C 5/14* (2013.01); *H03K 19/0008* (2013.01); *H03K 19/0013* (2013.01); *H10B 10/00* (2023.02); *H10B 12/00* (2023.02)

(58) Field of Classification Search
CPC .. H01L 27/0207; H10D 89/10; H10D 84/854; H03K 19/0008; H03K 19/0013
See application file for complete search history.

(56) References Cited

U.S. PATENT DOCUMENTS

| | | | |
|---|---|---|---|
| 2019/0214377 A1* | 7/2019 | Ryu | H01L 23/552 |
| 2021/0175171 A1* | 6/2021 | Jung | H01L 23/5286 |
| 2022/0208757 A1* | 6/2022 | Do | H01L 23/5286 |
| 2022/0366116 A1* | 11/2022 | Chang | G06F 30/392 |

FOREIGN PATENT DOCUMENTS

| | | | | |
|---|---|---|---|---|
| KR | 20190085588 A | * | 7/2019 | H01L 27/0207 |

\* cited by examiner

*Primary Examiner* — Ratisha Mehta
*Assistant Examiner* — Brad A Knudson
(74) *Attorney, Agent, or Firm* — WPAT LAW; Anthony King

(57) ABSTRACT

A semiconductor structure and a method for manufacturing the semiconductor structure are provided. The semiconductor structure comprises a first semiconductor device, a second semiconductor device, and a first semiconductor component. The first semiconductor device and the second semiconductor device defining a channel region. The first semiconductor component is disposed in the channel region and configured to control states of a plurality of components in the channel region. The first semiconductor device and the first semiconductor component are located adjacent to a boundary, and the first semiconductor component is electrically isolated from the first semiconductor device.

20 Claims, 10 Drawing Sheets

SEMICONDUCTOR STRUCTURE INCLUDING BOUNDARY HEADER CELL AND METHOD FOR MANUFACTURING THE SAME

BACKGROUND

The present disclosure relates, in general, to semiconductor structures and methods for manufacturing the same. Specifically, the present disclosure relates to a design layout for a boundary header cell.

Recently, the scale of semiconductor integrated circuits, including logic circuits, has been increasing. Although power consumption per element is reduced by miniaturization and a reduction in the voltage of elements, power consumption of the entire integrated circuit is being increased because the number of elements has increased. In IC design, power gating is a technique used for reducing power consumption by shutting off the current to blocks of the circuit that are inactive. A header cell is a power switch cell to control power delivery. The technique of power gating may reduce power leakage when a system is not actively operating. The header cell may provide a VDD or VSS to a switch. When a positive supply voltage VDD is gated, the power switch is referred to as the "header" switch. Similarly if a negative supply voltage VSS is gated, it can be referred to as a "footer" switch. A "header" switch in the design layout stage can be referred to as a "header" cell, and a "footer" switch in the design layout stage can be referred to as a "footer" cell.

Along with scaling in the electronics industry and the progress of semiconductor processing technologies, semiconductor chips are being integrated with an increasing number of electronic components to achieve improved electrical performance and additional functions. Accordingly, the number of elements is expected to increase while simultaneously keeping power consumption of the entire integrated circuit as low as possible.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
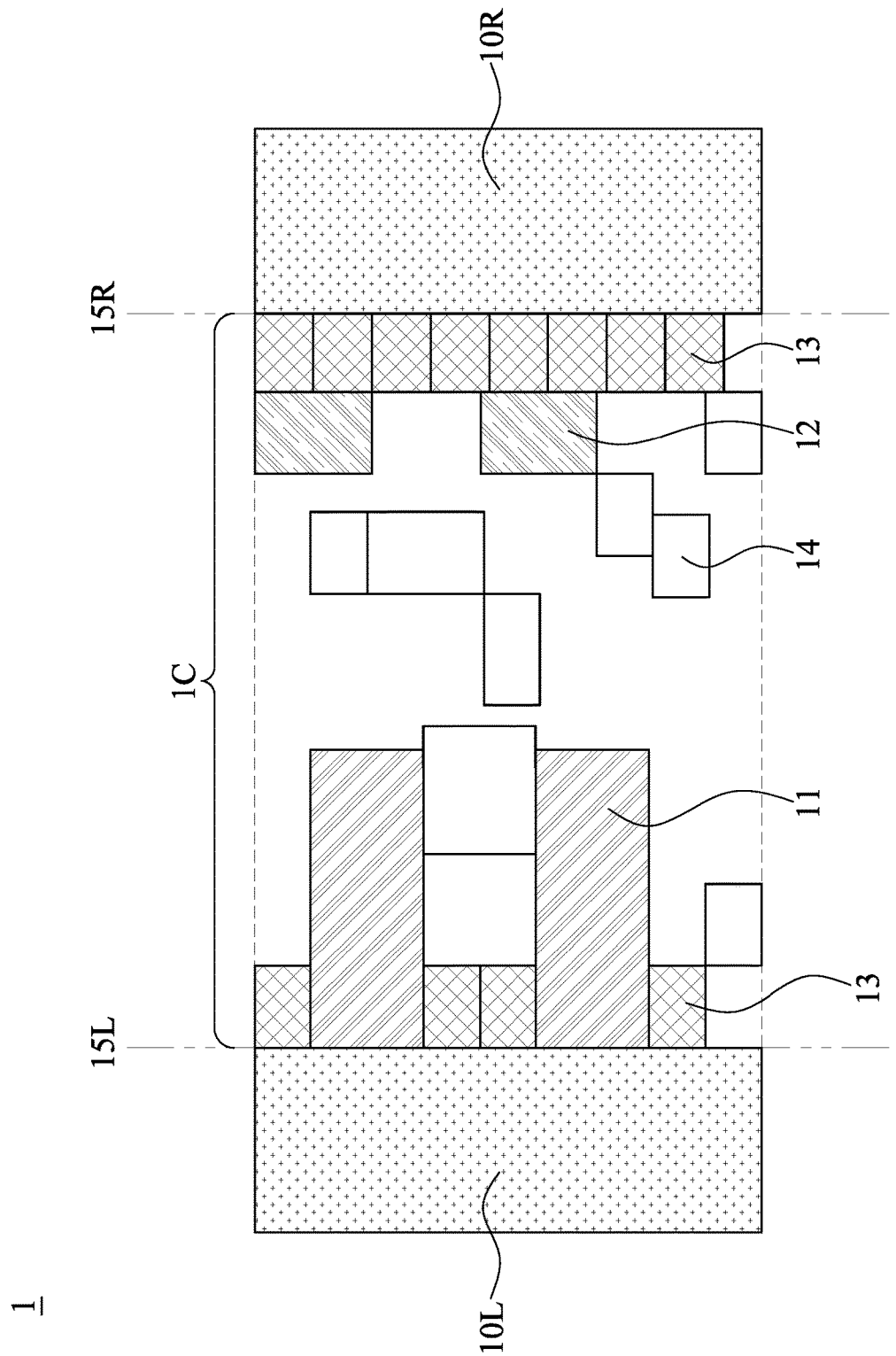
FIG. 1A is a top view of a layout of a semiconductor structure, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1A is a top view of a layout 1 of a semiconductor structure, in accordance with some embodiments of the present disclosure.

The layout 1 shows a top view of a semiconductor structure. The layout 1 includes regions for placing a first semiconductor device 10L, a second semiconductor device 10R, first semiconductor components 11, second semiconductor components 12, a plurality of boundary components 13, and a plurality of components 14.

The first semiconductor device 10L is spaced apart from the second semiconductor device 10R. The first semiconductor device 10L and the second semiconductor device 10R define a channel region 1C. The channel region 1C is a doped region/well. In some embodiments, the channel region 1C is an n-doped region/well. The channel region 1C may be a large n-doped well. In some embodiments, the first semiconductor device 10L or the second semiconductor device 10R may be a SRAM, a DRAM, a SDRAM, a MRAM, or an ASIC. The length and width of the channel region 1C is usually regarded as a limited resource in the IC design, and thus the space of the channel region 1C needs to be utilized effectively.

The plurality of boundary components 13 may be a boundary cell. The "boundary cell" mentioned in the present disclosure could refer to a cell having isolation functionality. The plurality of boundary components 13 are disposed in the channel region 1C. Some boundary components 13 are disposed in a left column adjacent to the first semiconductor device 10L. The other boundary components 13 are disposed in a right column adjacent to the second semiconductor device 10R. The plurality of boundary components 13 provide isolation at a boundary 15L of the first semiconductor device 10L. The plurality of boundary components 13 provide isolation at a boundary 15R of the second semiconductor device 10R. The plurality of boundary components 13 may prevent the plurality of components 14 from electrically connecting to the first semiconductor device 10L or the second semiconductor device 10R. In some embodiments, the plurality of boundary components 13 may include dummy oxide diffusion structures (not shown). The plurality of boundary components 13 may comprise high density plasma (HDP) oxide (e.g., a layer of oxide formed by an HDP chemical vapor deposition), undoped silicate glass (USG), fluorinated silicate glass (FSG), SiOx, SiN, the like, or a combination thereof. The boundary components 13 may be conformally formed along the boundaries 15L and 15R.

The left column of the boundary components 13 are disposed at the boundary 15L of the first semiconductor device 10L. The left column of the boundary components 13 are laterally disposed between the first semiconductor components 11 in a column. At least one of the first semiconductor components 11 is sandwiched by the left column of the boundary components 13. The left column of the boundary components 13 are horizontally disposed between the first semiconductor device 10L and at least one of the plurality of components 14.

The right column of the boundary components 13 are disposed at the boundary 15R of the second semiconductor device 10R. At least one of the right columns of the boundary components 13 may be horizontally disposed between the second semiconductor device 10R and at least one of the plurality of components 14 or between the second semiconductor device 10R and one of the second semiconductor components 12. At least two of the right columns of the boundary components 13 may be sandwiched by the second semiconductor device 10R and one of the second semiconductor components 12.

In some embodiments, the right column of the boundary components 13 may extend from the top side of the second semiconductor device 10R to the bottom side of the second semiconductor device 10R. The left column of the boundary components 13 may extend to the bottom side of the first semiconductor device 10L.

The first semiconductor components 11 are disposed in the channel region 1C. The first semiconductor components 11 are adjacent to the first semiconductor device 10L. The first semiconductor components 11 are spaced apart from each other by the boundary components 13. The first semiconductor components 11 may be surrounded by the plurality of components 14. The first semiconductor components 11 may be surrounded by the first semiconductor device 10L, the boundary components 13, and the plurality of components 14.

In some embodiments, the first semiconductor components 11 may be a boundary header cell. The "boundary header cell" mentioned in the present disclosure could refer to a switch/transistor that can control whether power/current is provided to a subsequent stage of the system of ICs. The boundary header cell 11 may control states of the plurality of components 14. The boundary header cell 11 may control whether the plurality of components 14 function or not. The boundary header cell 11 may selectively turn on or cut off the plurality of components 14. The boundary header cell 11 is configured to activate or deactivate each of the plurality of components 14. The boundary header cell 11 may obtain power from the second semiconductor components 12.

Simultaneously, since the boundary header cell 11 also includes an insulation boundary, the boundary header cell 11 could be located at the boundary 15L without any additional boundary components 13 between the first semiconductor device 10L and the boundary header cell 11, such that available regions may be increased and the circuit design would be simplified. Both the first semiconductor device 10L and the boundary header cells 11 are located at the boundary 15. The first semiconductor device 10L and the boundary header cells 11 are electrically isolated from each other. The first semiconductor device 10L is electrically disconnected from boundary header cells 11. The boundary header cell 11 may control power, reduce leakage, and be isolated from the first semiconductor device 10L. The boundary header cell 11 may isolate the components 14 from the first semiconductor device 10L.

The second semiconductor components 12 are disposed in the channel region IC. The second semiconductor components 12 are adjacent to the right column of the boundary components 13. The second semiconductor components 12 are located at a boundary of the right column of the boundary components 13. The second semiconductor components 12 are disposed between the right column of the boundary components 13 and the components 14. The second semiconductor components 12 may be spaced apart from the boundary components 13. The second semiconductor components 12 may be adjacent to the components 14. The second semiconductor components 12 may be spaced apart from the components 14.

The second semiconductor components 12 may be a tap cell. The "tap cell" mentioned in the present disclosure could refer to well tap cells (or tap cells, tap wells) which are used for preventing latch-up in a CMOS design. For example, a tap cell may connect an n-type well to a positive voltage (VDD) and connect a p-type substrate to a negative supply voltage or a grounding voltage (VSS) to prevent latch-up.

The tap cells 12 may provide power to the boundary header cells 11. The tap cells 12 may be electrically connected to the boundary header cells 11. The tap cells 12 may cooperate with the boundary header cells 11 for preventing latch-up. The tap cells 12 and the boundary header cells 11 could be disposed within an electronic device. Accordingly, the overall system could continue operations even if one of the tap cells 12 and the boundary header cells 11 located within the channel region 1C is damaged during the formation or operations.

In some embodiments, the layout 1 may include one boundary header cell 11 and one tap cell 12 to obtain more space for accommodating more components 14 in the channel region 1C. The tap cell 12 may be the only component that provides power to the boundary components 13.

The plurality of components 14 are disposed in the channel region 1C. The plurality of components 14 are disposed between the left column of the boundary components 13 and the right column of the boundary components 13. The plurality of components 14 may be disposed between two boundary header cells 11. The plurality of components 14 may be disposed between one of the boundary header cells 11 and one of the tap cells 12. Any one of the plurality of components 14 may be disposed at an appropriate location in the channel region 1C.

In some embodiments, the plurality of components 14 may be logical components. The plurality of components 14 may include an AND gate component, an OR gate component, a NOT gate component, a NAND gate component, a NOR gate component, and an XOR gate component. The plurality of components 14 are controlled by the boundary header cells 11. A source of one of the plurality of components 14 is controlled by the boundary header cells 11. A turned-on state or cutoff state of one of the plurality of components 14 is controlled by the boundary header cells 11.

Figure 1B:
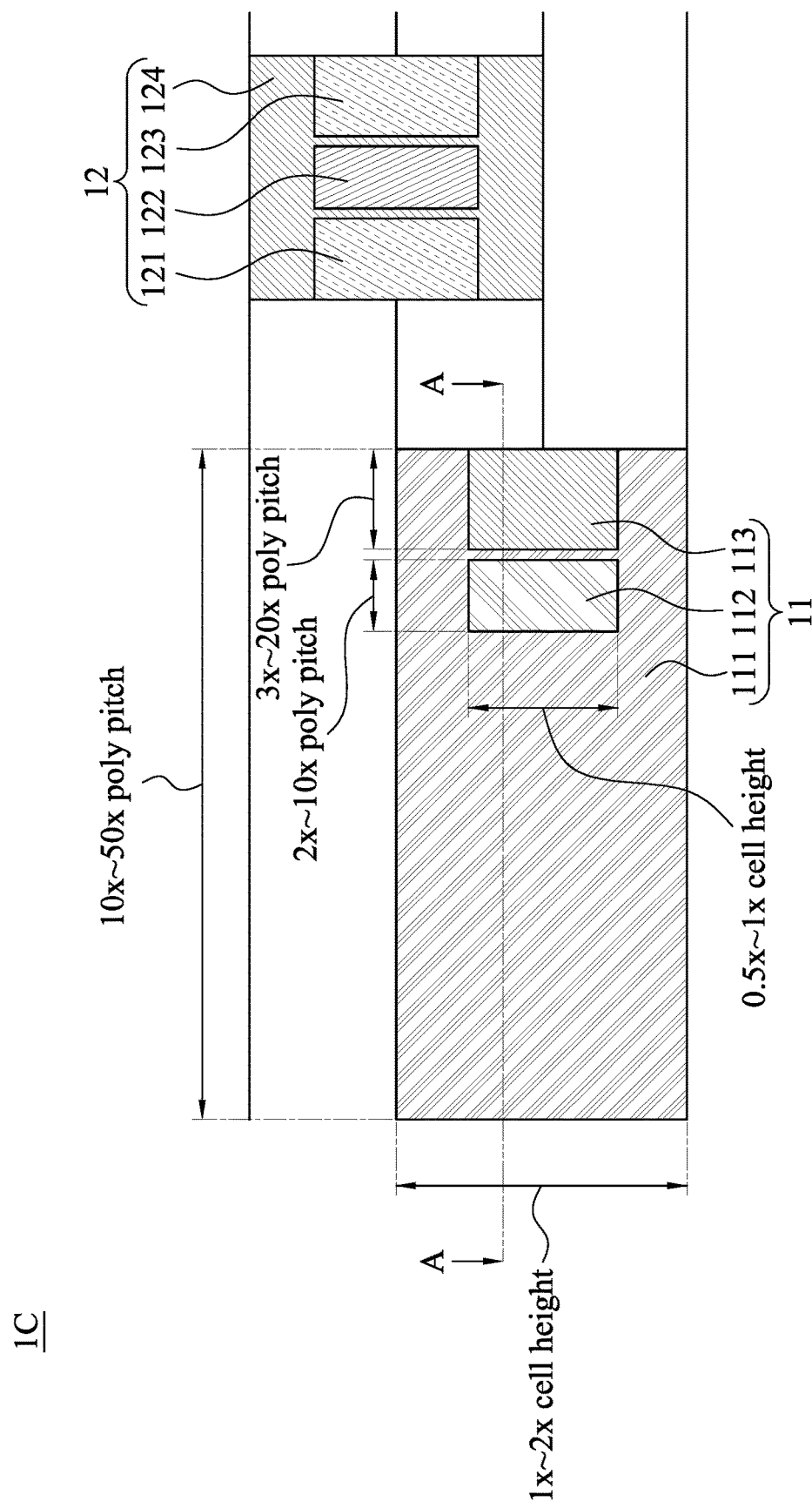
FIG. 1B is a top view of a layout of a semiconductor structure, in accordance with some embodiments of the present disclosure.

FIG. 1B is a simplified view of the channel region 1C of the layout 1, in accordance with some embodiments of the present disclosure.

The boundary header cell 11 and the tap cell 12 are disposed within the channel region IC. The boundary header cell 11 and the tap cell 12 are spaced apart from each other. The channel region 1C includes a large n-doped well.

The boundary header cell 11 includes an n-doped region 111, an n-type tap 112, and a p-doped region 113. The n-doped region 111 may be an n-type well. The p-doped region 113 may be a p-type well or a p-type substrate. The n-doped region 111 is connected to the large n-doped well. The n-doped region 111 may be connected to the components 14 as shown in FIG. 1A. In some embodiments, the n-doped region 111 may be part of the large n-doped well of the channel region 1C. The left boundary of the boundary header cell 11 is an insulation boundary formed by an ultra-thin isolation layer which is not shown in FIG. 1B. The insulation boundary of the boundary header cell 11 is connected to the first semiconductor device 10L. There can be many metal-oxide-semiconductor field-effect transistors (MOSFETs) in the n-doped region 111. The MOSFETs may be PMOS. In order to clearly show the relationship of the n-doped region 111, the n-type tap 112, and the p-doped region 113, the MOSFETs would normally be presented in FIG. 1C, but are not shown here for simplicity.

The n-type tap 112 is disposed within the n-doped region 111. The n-type tap 112 may be configured to provide power to the plurality of components 14 as shown in FIG. 1A. The p-doped region 113 may be disposed within the n-doped region 111. The n-type tap 112 is adjacent to the p-doped region 113. The n-type tap 112 is electrically connected to a power supply and configured to provide a voltage to the n-doped region 111. The p-doped region 113 is located at the right boundary of the boundary header region 11. The p-doped region 113 is connected to the large n-doped well. The p-doped region 113 may be connected to the components 14 as shown in FIG. 1A. The p-doped region 113 is not floating and may be powered by the tap cell 12. The voltage level of the p-doped region 113 may be kept in a stable state.

In some embodiments, a height of the n-doped region 111 of the boundary header cell 11 may be the height of 1 to 2 cells. A width of the n-doped region 111 of the boundary header cell 11 may be 10 poly-gate pitches to 50 poly-gate pitches. The boundary header cell 11 may have around ten to fifty PMOS in a row. A height of the n-type tap 112 of the boundary header cell 11 may be the height of 0.5 to 1 cell. A width of the n-type tap 112 of the boundary header cell 11 may be 2 poly-gate pitches to 10 poly-gate pitches. A height of the p-doped region 113 of the boundary header cell 11 may be the height of 0.5 to 1 cell. A width of the p-doped region 113 of the boundary header cell 11 may be 3 poly-gate pitches to 20 poly-gate pitches.

The tap cell 12 includes a first n-doped region 121, a p-type tap 122, a second n-doped region 123, and a p-doped region 124. The first n-doped region 121 and the second n-doped region 123 may be n-type wells. The p-doped region 124 may be a p-type well. The first n-doped region 121, the p-type tap 122, and the second n-doped region 123 are disposed within the p-doped region 124. The p-type tap 122 is surrounded by the first n-doped region 121, the second n-doped region 123, and the p-doped region 124.

The first n-doped region 121 is connected to the large n-doped region. The right side of the second n-doped region 123 and that of the p-doped region 124 are connected to the right column of the boundary components 13 as shown in FIG. 1A. The first n-doped region 121 may be connected to the components 14 as shown in FIG. 1A. The p-doped region 124 may be connected to the components 14 as shown in FIG. 1A. In some embodiments, the p-doped region 124 is disposed within the large n-doped well of the channel region 1C. There are many metal-oxide-semiconductor field-effect transistors (MOSFETs) in the n-doped well 111. The MOSFETs may be PMOS. In order to clearly show the relationship of the first n-doped region 121, the p-type tap 122, the second n-doped region 123, and the p-doped region 124, the PMOS are not shown here.

The p-type tap 122 of the tap cell 12 may be connected to a power supply and may be configured to provide a voltage to the p-doped region 113 of the boundary header cell 11 through the p-doped region 124. In some embodiments, a p-well path may be disposed in the channel region 1C to connect the p-doped region 124 to the p-doped region 113.

Figure 1C:
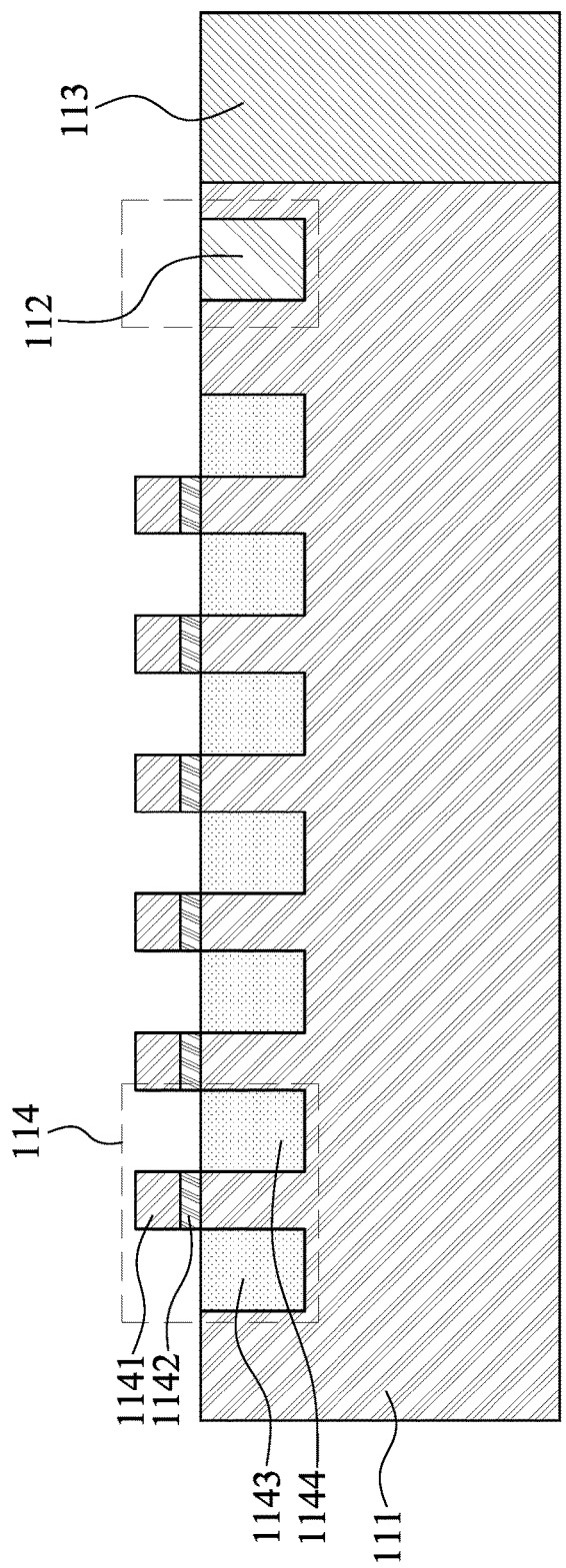
FIG. 1C is a cross-section view of a layout of a semiconductor device, in accordance with some embodiments of the present disclosure.

FIG. 1C is a cross-section view of the boundary header cell 11 of the layout 1 of a semiconductor device across line A-A in FIG. 1B, in accordance with some embodiments of the present disclosure.

The boundary header cell 11 includes an n-doped region 111, an n-type tap 112, a p-doped region 113, and a plurality of PMOS 114. The PMOS 114 are not shown in FIG. 1B for simplicity. The n-doped region 111 is connected to the p-doped region 113. The p-doped region 113 is located at the right boundary of the boundary header cell 11. The n-doped region 111 includes an isolation region. The isolation region has an isolation boundary. The isolation region may be an oxide diffusion region located at the left boundary of the boundary header cell 11. The isolation boundary of the oxide diffusion region 1s located at the boundary 15L. In some embodiments, the oxide diffusion region may be an ultra-thin isolation layer for a semiconductor device manufactured under a 28 nm process. The ultra-thin isolation layer may comprise high density plasma (HDP) oxide (e.g., a layer of oxide formed by an HDP chemical vapor deposition). Since the oxide diffusion region 1s an ultra-thin isolation layer, it is not illustrated in FIG. 1C. The oxide diffusion region may be directly connected to the first semiconductor device 10L.

In some embodiments, the oxide diffusion region may be an isolation layer for a semiconductor device manufactured under a 50 nm process. The isolation layer may comprise tetraethylorthosilicate (TEOS) oxide, undoped silicate glass (USG), doped silicon oxide such as borophosphosilicate glass (BPSG), fused silica glass (FSG), phosphosilicate glass (PSG), boron doped silicon glass (BSG), SiOx, SiN, and the like, or a combination thereof.

In some embodiments, the PMOS cells may be isolated from each other by a dielectric spacer. A length of an active region of a PMOS cell can affect the mobility of carriers (e.g., hole or electron), affecting the performance of a semiconductor device. For example, a p-type field-effect transistor (FET) tends to have a relatively long active region. Various embodiments of the present disclosure provide layouts to adjust the length of the active regions in either p-type FET, N-type FET or both to improve the performance of the semiconductor device.

The n-type tap 112 is disposed within the n-doped region 111. The n-type tap 112 is spaced apart from the p-doped region 113 by a distance. The n-type tap 112 is an n+-doped region.

The PMOS 114 is disposed in the n-doped region 111. The PMOS 114 includes a poly gate 1141, an isolation layer 1142, a p+-doped region 1143, and a p+-doped region 1144. The poly gate 1141 may be an n+-doped poly gate. The isolation layer 1142 may be an oxide layer. The p+-doped region 1143 and the p+-doped region 1144 may be the source and the drain, respectively. The source 1143 may be electrically connected to a power supply (e.g., VDD source) and the drain 1144 may be electrically connected to another power supply (e.g., VDD of a cell). In some embodiments, the p+-doped region 1143 and the p-doped region 1144 may be the drain and the source, respectively. The PMOS 114 may be powered by the tap cell 12 as shown in FIG. 1B. The PMOS 114 may be used for controlling at least one of the components 14 as shown in FIG. 1A.

Figure 2A:
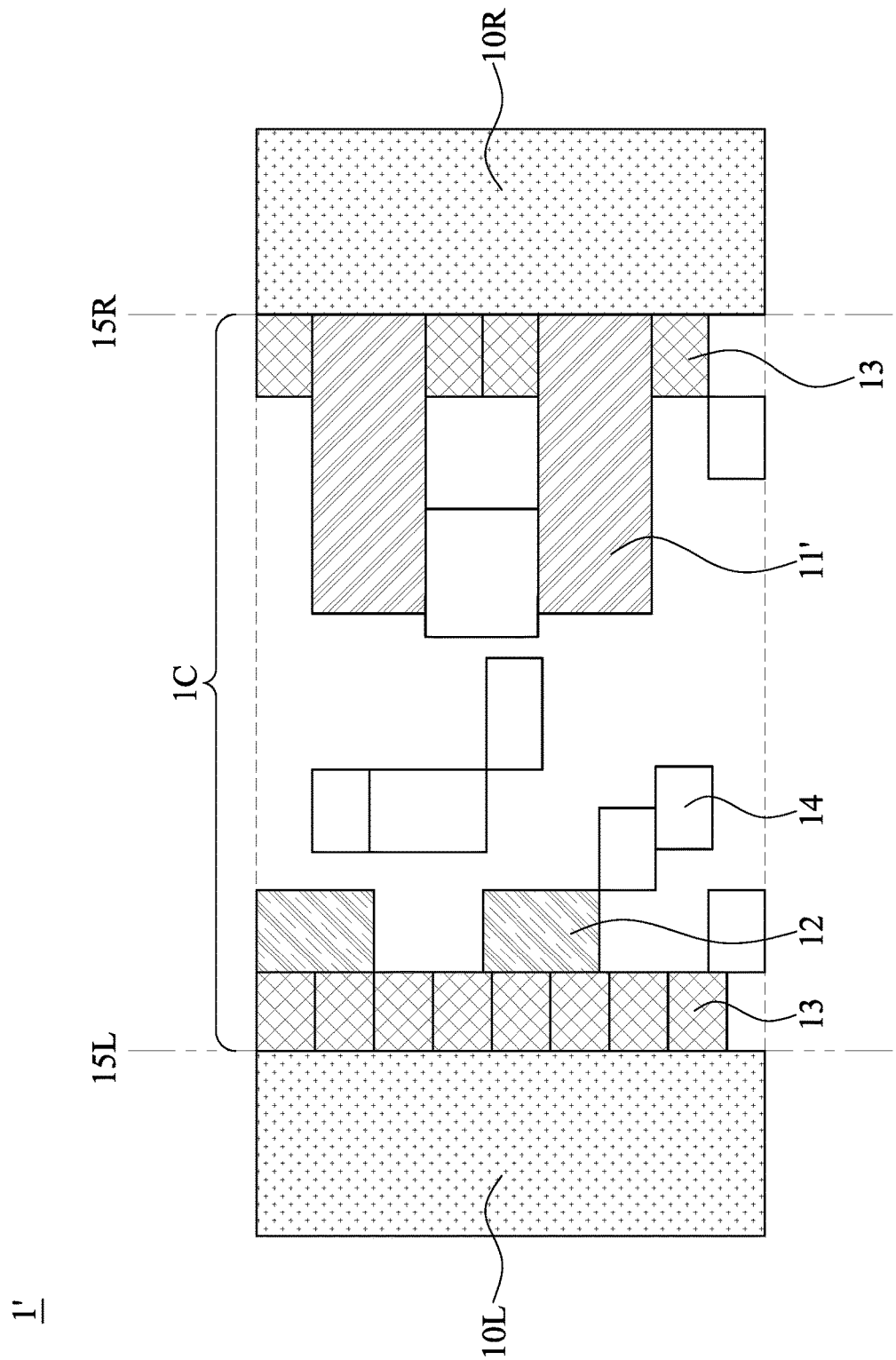
FIG. 2A is a top view of a layout of a semiconductor structure, in accordance with some embodiments of the present disclosure.

FIG. 2A is a top view of a layout 1' of a semiconductor structure, in accordance with some embodiments of the present disclosure.

The layout 1' includes regions for placing a first semiconductor device 10L, a second semiconductor device 10R, first semiconductor components 11', second semiconductor components 12, a plurality of boundary components 13, and a plurality of components 14. The layout 1' is similar to the layout 1 of FIG. 1A. The layout 1' is a mirroring structure of the layout 1.

The first semiconductor components 11' may be boundary header cells. The first semiconductor components 11' are disposed in the channel region 1C. The first semiconductor components 11' are adjacent to the second semiconductor device 10R. The first semiconductor components 11' are located at the boundary 15R. The first semiconductor components 11' are spaced apart from each other by the boundary components 13. The first semiconductor components 11' may be surrounded by the plurality of components 14. The first semiconductor components 11' may be surrounded by the second semiconductor device 10R, the boundary components 13, and the plurality of components 14.

The functions of the first semiconductor components 11' are identical to the first semiconductor components 11 as shown in FIG. 1A. The first semiconductor components 11' may be configured to states of the plurality of components 14. The first semiconductor components 11' may be configured to activate or deactivate the plurality of components 14. The first semiconductor components 11' are electrically isolated from the second semiconductor device 10R.

Figure 2B:
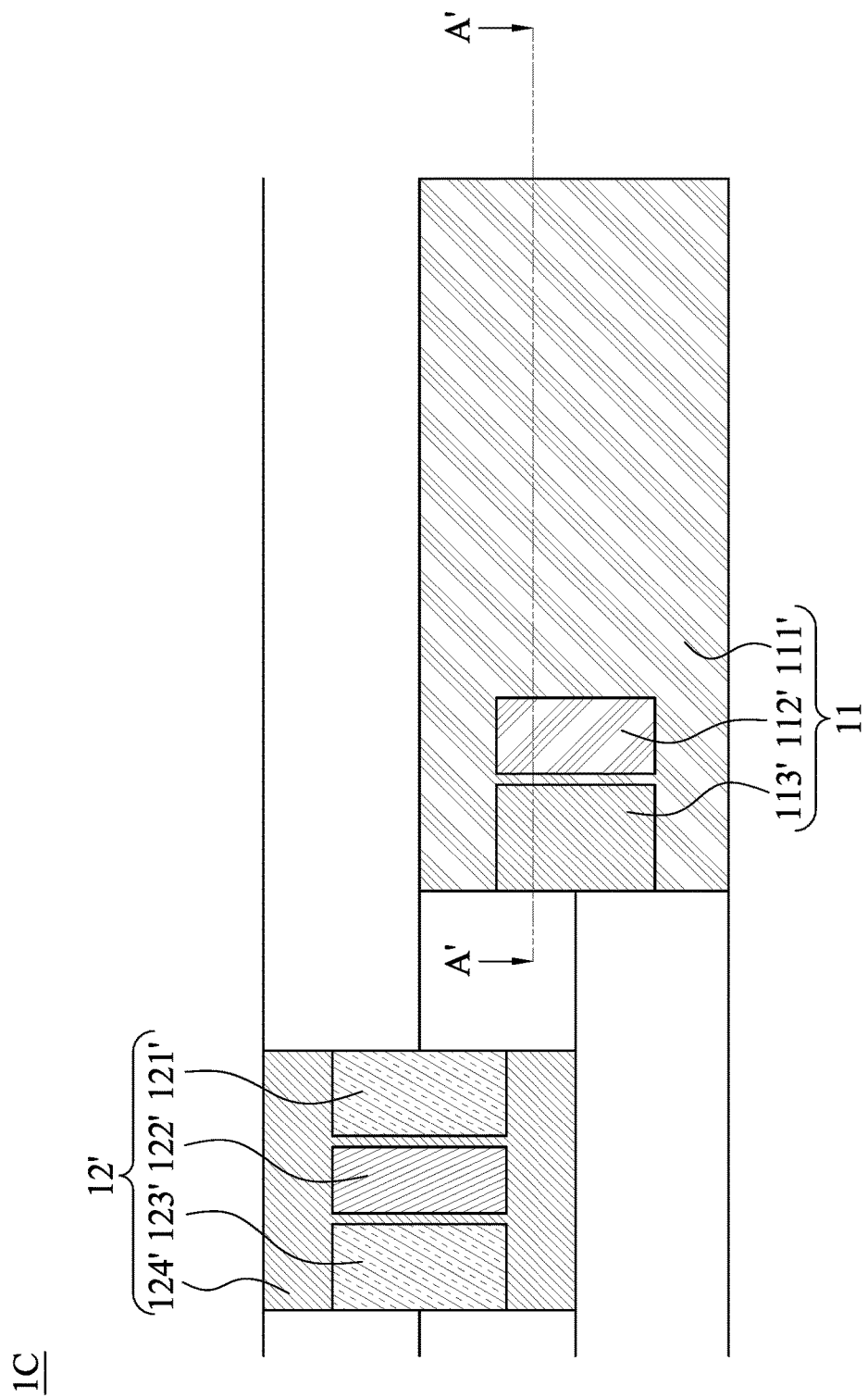
FIG. 2B is a top view of a layout of a semiconductor structure, in accordance with some embodiments of the present disclosure.

FIG. 2B is a simplified view of the channel region 1C of the layout 1', in accordance with some embodiments of the present disclosure.

The boundary header cell 11' and the tap cell 12' are disposed within the channel region 1C. The boundary header cell 11' and the tap cell 12' are spaced apart from each other. The channel region IC includes a large n-doped well. The boundary header cell 11' and the tap cell 12' are mirroring structures of the boundary header cell 11 and the tap cell 12 as shown in FIG. 1B.

The boundary header cell 11' includes an n-doped region 111', an n-type tap 112', and a p-doped region 113'. The right boundary of the boundary header cell 11' is an insulation boundary formed by an ultra-thin isolation layer which is not shown in FIG. 2B. The insulation boundary of the boundary header cell 11' is connected to the second semiconductor device 10R. There are many MOSFETs in the n-doped region 111'. The MOSFETs may be PMOS, which are not shown here for simplicity.

The tap cell 12' includes a first n-doped region 121', a p-type tap 122', a second n-doped region 123', and a p-doped region 124'. The functions of the boundary header cell 11' and the tap cell 12' are identical to those of the boundary header cell 11 and the tap cell 12.

Figure 2C:
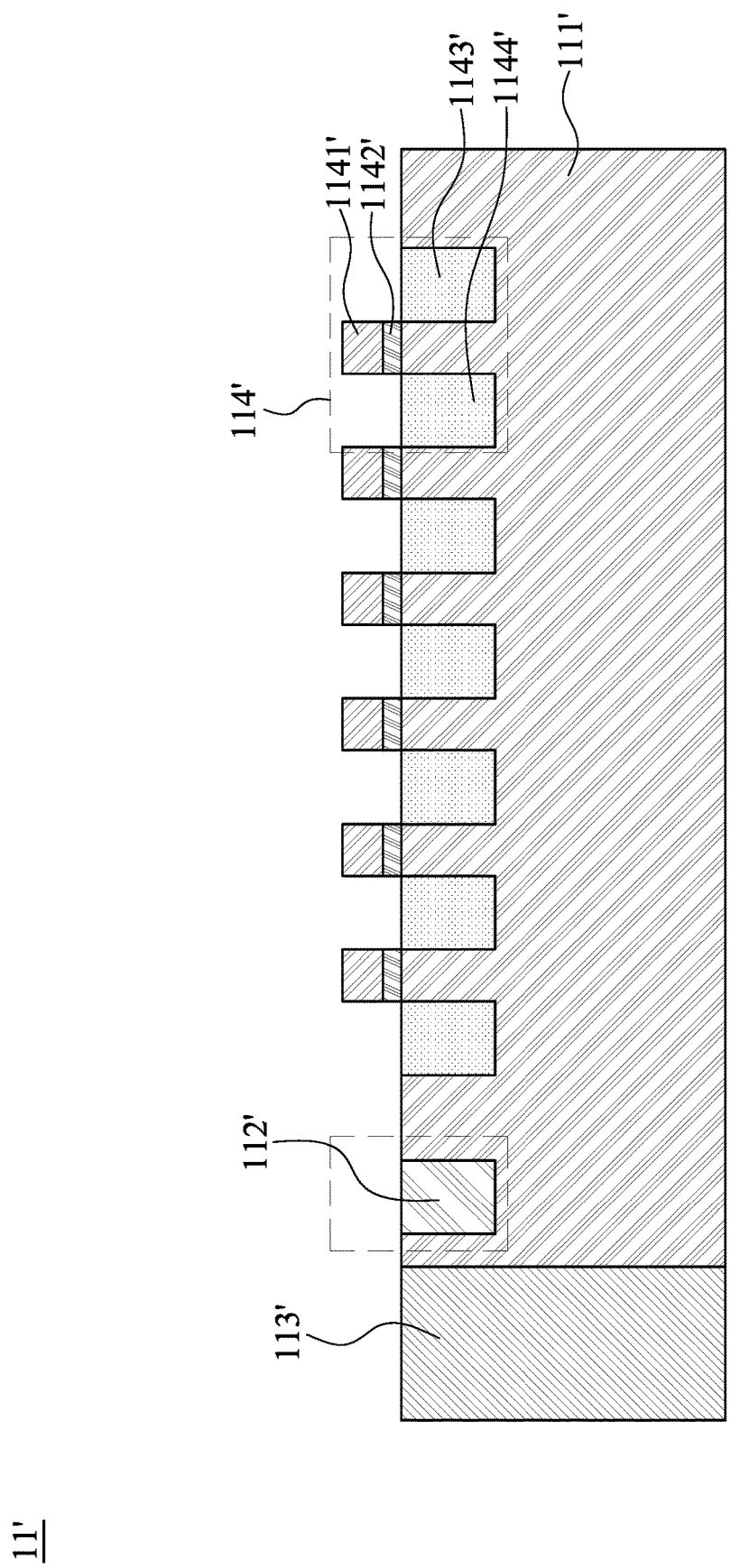
FIG. 2C is a cross-section view of a layout of a semiconductor device, in accordance with some embodiments of the present disclosure.

FIG. 2C is a cross-section view of the boundary header cell 11' of the layout 1' of a semiconductor device across line A'-A' in FIG. 2B, in accordance with some embodiments of the present disclosure.

The boundary header cell 11' includes an n-doped region 111', an n-type tap 112', a p-doped region 113', and a plurality of PMOS 114'. The PMOS 114' are not shown in FIG. 2B for simplicity. The n-doped region 111' is connected to the p-doped region 113'. The n-doped region 111' includes an oxide diffusion region located at the right boundary of the boundary header cell 11'. In some embodiments, the oxide diffusion region may be an ultra-thin isolation layer. The ultra-thin isolation layer may comprise high density plasma (HDP) oxide (e.g., a layer of oxide formed by an HDP chemical vapor deposition). Since the oxide diffusion region 1s an ultra-thin isolation layer, it is not illustrated in FIG. 2C. The oxide diffusion region may be directly connected to the second semiconductor device 10R.

The n-type tap 112' is disposed within the n-doped region 111'. The n-type tap 112' is spaced apart from the p-doped region 113' by a distance. The n-type tap 112' is an n+-doped region.

The PMOS 114' is disposed in the n-doped region 111'. The PMOS 114' includes a poly gate 1141', an isolation layer 1142', a p$^+$-doped region 1143', and a p$^+$-doped region 1144'.

Figure 3:
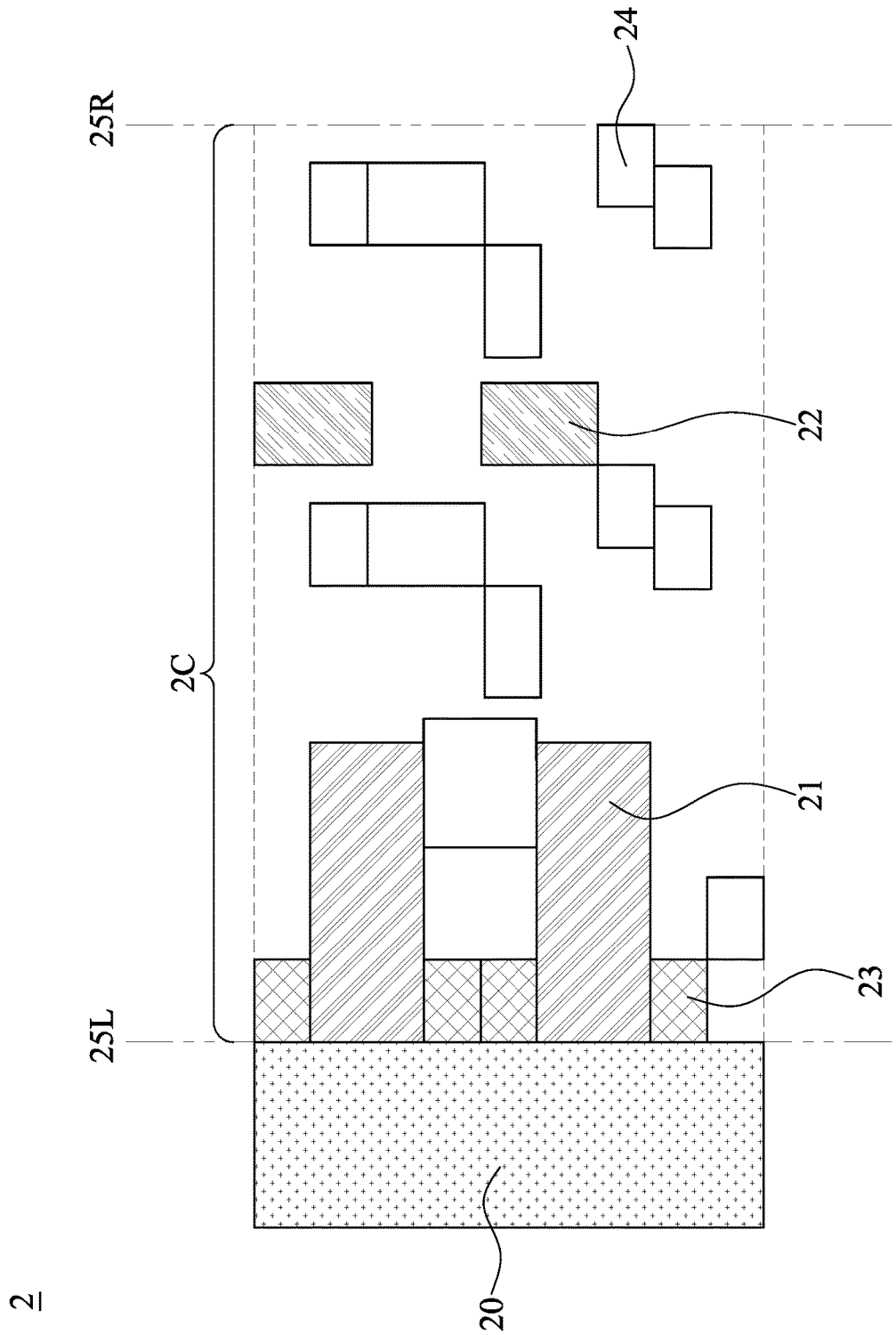
FIG. 3 is a top view of a layout of a semiconductor structure, in accordance with some embodiments of the present disclosure.

FIG. 3 is a top view of a layout 2 of a semiconductor structure, in accordance with some embodiments of the present disclosure.

The layout 2 includes regions for placing a semiconductor device 20, first semiconductor components 21, second semiconductor components 22, a plurality of boundary components 23, and a plurality of components 24.

The semiconductor device 20 and at least one of the plurality of components 24 define a channel region 2C. The channel region 2C is an n-doped region/well. The channel region 2C may be a large n-doped well. In some embodiments, the semiconductor device 20 may be a SRAM, a DRAM, a SDRAM, a MRAM, or an ASIC. The length and width of the channel region 1C is limited by the IC design. The space of the channel region 1C has to be utilized effectively. The second semiconductor components 22 may be surrounded by the plurality of components 24. The second semiconductor components 22 may be disposed at the boundary 25R. The plurality of components 24 may be disposed at the boundary 25R.

The structure of the layout 2 is similar to the structure of the layout 1 except that the layout 2 only has a semiconductor device 20 rather than two semiconductor devices 20 disposed at boundaries 25L, 25R, respectively.

Figure 4:
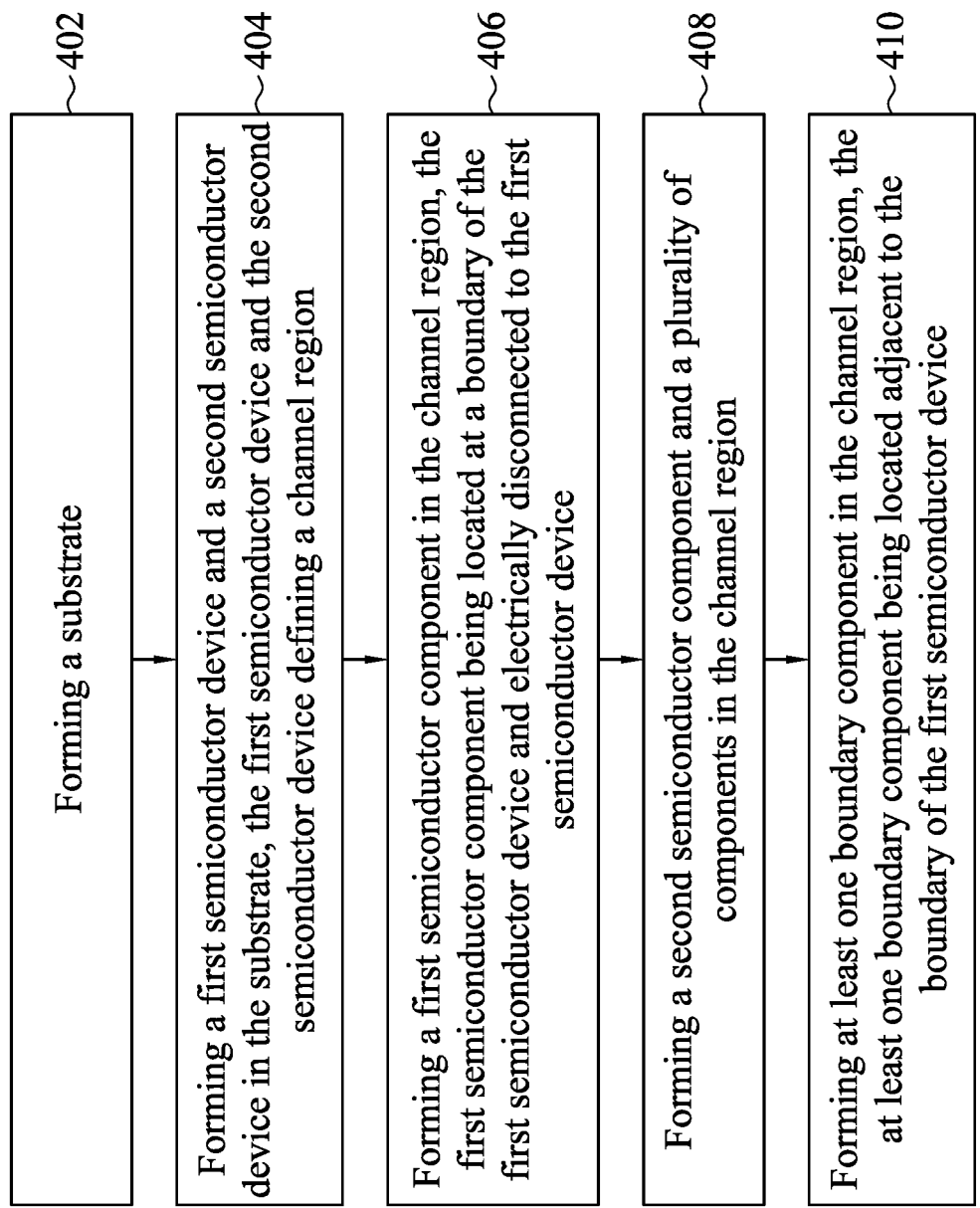
FIG. 4 is a flowchart of operations for manufacturing a semiconductor structure, in accordance with some embodiments of the present disclosure.

FIG. 4 is a flowchart of operations for manufacturing a semiconductor device, in accordance with some embodiments of the present disclosure.

FIG. 4 includes operations 402, 404, 406, 408, and 410 for manufacturing a semiconductor device. In the operation 402, a substrate is formed. The substrate may be a semiconductor substrate (e.g., a wafer). The semiconductor substrate may be a silicon substrate. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof. In an embodiment, the substrate may be a semiconductor on insulator (SOI) substrate. The SOI substrate may include a buried oxide (BOX) layer formed by a process such as separation by implanted oxygen (SIMOX), and/or other suitable processes. The substrate may include doped regions, such as p-wells and n-wells.

In the operation 404, a first semiconductor device and a second semiconductor device are formed in the substrate. The first semiconductor device and the second semiconductor device define a channel region. The first semiconductor device, the second semiconductor device, and the channel region may correspond to the first semiconductor components 11, the second semiconductor components 12, and the channel region 1C as shown in FIG. 1A.

In the operation 406, a first semiconductor component is formed in the channel region. The first semiconductor component may correspond to the first semiconductor component 11 as shown in FIG. 1A. The first semiconductor component is located at a boundary of the first semiconductor device and electrically disconnected from the first semiconductor device. The first semiconductor component is configured to provide power to the substrate and be electrically isolated from the first semiconductor device.

The left side of the first semiconductor component may include an isolation region to electrically isolate from the first semiconductor device. The isolation region may be formed by HDP chemical vapor deposition, a plasma-enhanced chemical vapor deposition (PECVD) process and/or other suitable deposition or oxidation processes.

In the operation 408, a second semiconductor component and a plurality of components are formed in the channel region. The second semiconductor component and the plurality of components may correspond to the second semiconductor component 12 and the plurality of components 14 as shown in FIG. 1A. The states of the plurality of components are controlled by the first semiconductor component. The first semiconductor component is configured to activate or deactivate each of the plurality of components.

In the operation 410, at least one boundary component is formed in the channel region. The at least one boundary component may correspond to one of the boundary components 13 as shown in FIG. 1A. The at least one boundary component is located adjacent to the boundary of the first semiconductor device.

Figure 5:
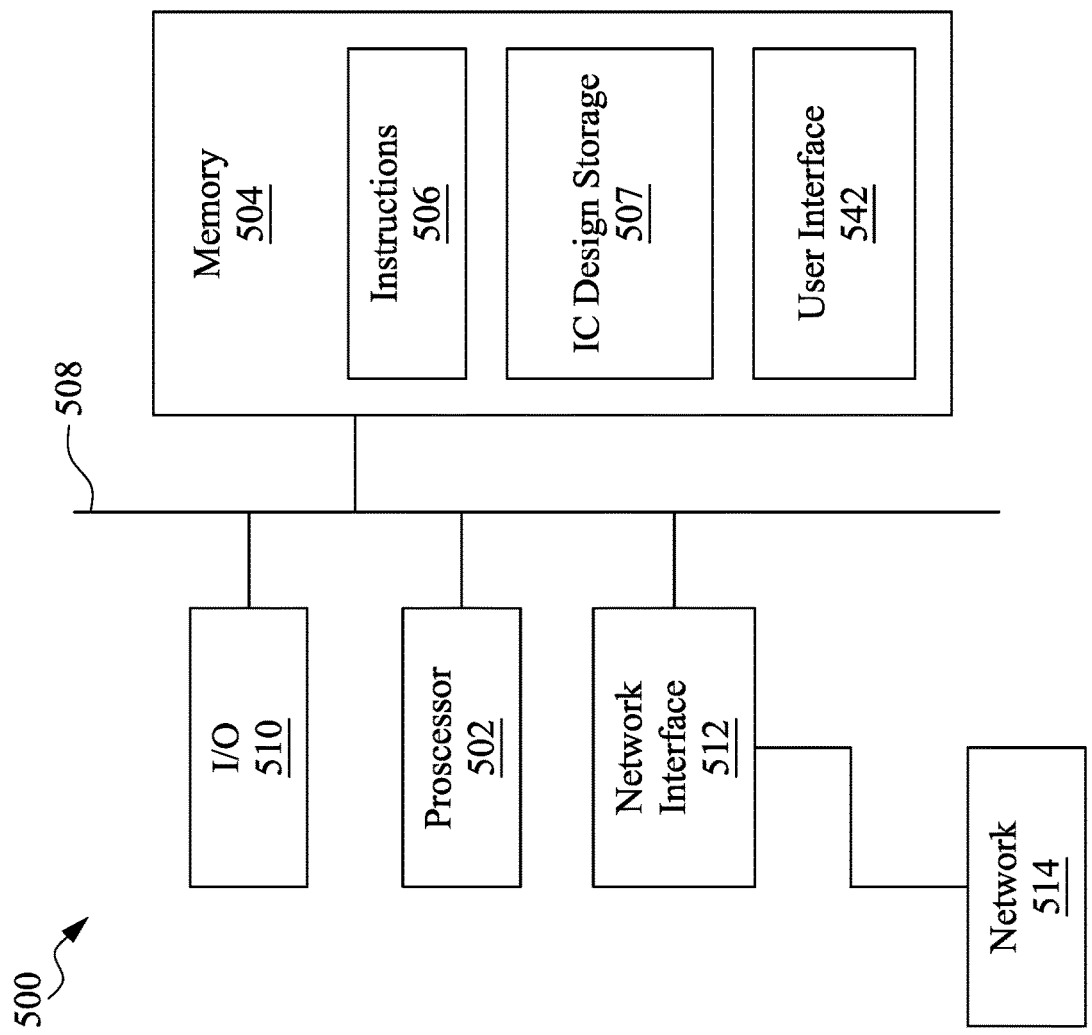
FIG. 5 is a block diagram of an IC layout diagram generation system, in accordance with some embodiments.

FIG. 5 is a block diagram of IC design system 500, in accordance with some embodiments. Methods described herein of designing IC layout diagrams in accordance with one or more embodiments are implementable, for example, using IC design system 500, in accordance with some embodiments. In some embodiments, IC design system 500 can be an automatic placement and routing (APR) system, can include an APR system, or can be a part of an APR system, usable for performing an APR method.

In some embodiments, IC design system 500 includes a processor 502 and non-transitory, computer-readable memory 504. Memory 504, amongst other things, is encoded with, i.e., stores, computer program code, i.e., a set of executable instructions 506. Execution of instructions 506 by the processor 502 represents (at least in part) an EDA tool which implements a portion or all of a method, e.g., a method of generating an IC layout diagram described above (hereinafter, the noted processes and/or methods).

Processor 502 is electrically coupled to computer-readable memory 504 via a bus 508. Processor 502 is also electrically coupled to an I/O interface 510 by bus 508. Network interface 512 is also electrically connected to processor 502 via bus 508. Network interface 512 is connected to a network 514, so that processor 502 and computer-readable memory 504 are capable of connecting to external elements via network 514. Processor 502 is configured to execute instructions 506 encoded in computer-readable memory 504 in order to cause IC design system 500 to be usable for performing a portion or all of the noted processes and/or methods. In one or more embodiments, processor 502 is a central processing unit (CPU), a multi-processor, a distributed processing system, an application specific integrated circuit (ASIC), and/or a suitable processing unit.

In one or more embodiments, memory 504 is an electronic, magnetic, optical, electromagnetic, infrared, and/or a semiconductor system (or apparatus or device). For example, memory 504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, memory 504 includes a compact disk-read only memory (CD-ROM), a compact disk-read/write (CD-R/W), and/or a digital video disc (DVD).

In one or more embodiments, memory 504 stores instructions 506 configured to cause IC design system 500 (where such execution represents (at least in part) the EDA tool) to be usable for performing a portion or all of the noted processes and/or methods. In one or more embodiments, memory 504 also stores information which facilitates performing a portion or all of the noted processes and/or methods. In one or more embodiments, memory 504 includes IC design storage 507 configured to store one or more IC layout diagrams. 100771IC design system 500 includes I/O interface 510. I/O interface 510 is coupled to external circuitry. In one or more embodiments, I/O interface 510 includes a keyboard, keypad, mouse, trackball, trackpad, touchscreen, and/or cursor direction keys for communicating information and commands to processor 502.

IC design system 500 also includes network interface 512 coupled to processor 502. Network interface 512 allows IC design system 500 to communicate with network 514, to which one or more other computer systems are connected. Network interface 512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC design systems 1000.

IC design system 500 is configured to receive information through I/O interface 510. The information received through I/O interface 510 includes one or more of instructions, data, design rules, libraries of standard cells, and/or other parameters for processing by processor 502. The information is transferred to processor 502 via bus 508. IC design system 500 is configured to receive information related to a UI through I/O interface 510. The information is stored in memory 504 as user interface (UI) 542.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC design system 500. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 6:
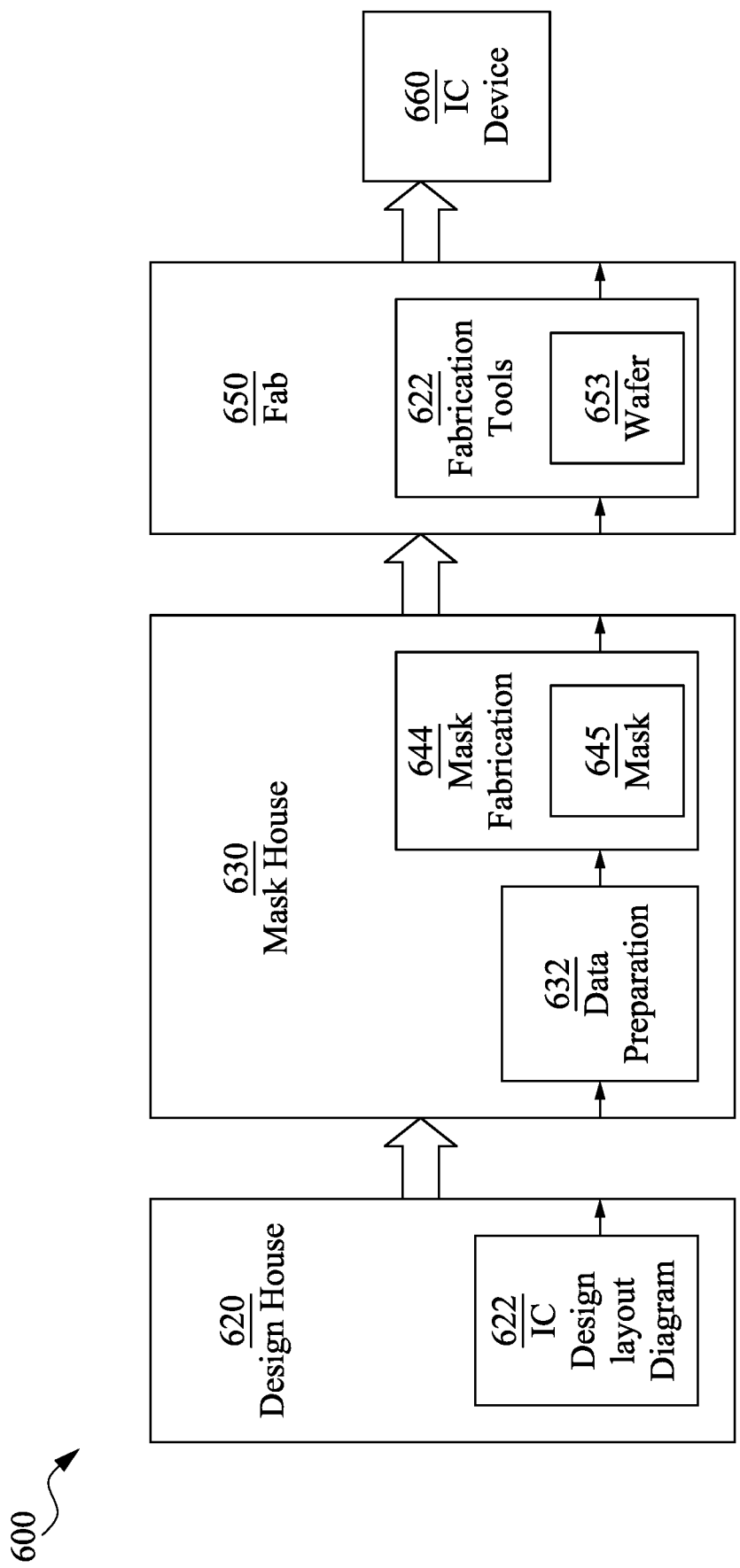
FIG. 6 is a block diagram of an IC manufacturing system, and an IC manufacturing flow associated therewith, in accordance with some embodiments.

FIG. 6 is a block diagram of IC manufacturing system 600, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 600.

In FIG. 6, IC manufacturing system 600 includes entities, such as a design house 620, a mask house 630, and an IC manufacturer/fabricator ("fab") 650, that interact with one another in the design, development, and manufacturing cycles and/or services related to manufacturing an IC device 660. The entities in system 600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 620, mask house 630, and IC fab 650 is owned by a single larger company. In some embodiments, two or more of design house 620, mask house 630, and IC fab 650 coexist in a common facility and use common resources.

Design house (or design team) 620 generates an IC design layout diagram 622. IC design layout diagram 622 includes various geometrical patterns, e.g., an IC layout diagram discussed above. The geometrical patterns correspond to patterns of metal, oxide, or semiconductor layers that make up the various components of IC device 660 to be fabricated. The various layers combine to form various IC features. For example, a portion of IC design layout diagram 622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 620 implements a proper design procedure to form IC design layout diagram 622. The design procedure includes one or more of logic design, physical design or place and route. IC design layout diagram 622 is presented in one or more data files having information of the geometrical patterns. For example, IC design layout diagram 622 can be expressed in a GDSII file format or DFII file format.

Mask house 630 includes data preparation 632 and mask fabrication 644. Mask house 630 uses IC design layout diagram 622 to manufacture one or more masks 645 to be used for fabricating the various layers of IC device 660 according to IC design layout diagram 622. Mask house 630 performs mask data preparation 632, where IC design layout diagram 622 is translated into a representative data file (RDF). Mask data preparation 632 provides the RDF to mask fabrication 644. Mask fabrication 644 includes a mask writer. A mask writer converts the RDF to an image on a substrate, such as mask (reticle) 645 or a semiconductor wafer 653. The design layout diagram 622 is manipulated by mask data preparation 632 to comply with particular characteristics of the mask writer and/or requirements of IC fab 650. In FIG. 11, mask data preparation 632 and mask fabrication 644 are illustrated as separate elements. In some embodiments, mask data preparation 632 and mask fabrication 644 can be collectively referred to as mask data preparation.

In some embodiments, mask data preparation 632 includes optical proximity correction (OPC) which uses lithography enhancement techniques to compensate for image errors, such as those that can arise from diffraction, interference, other process effects and the like. OPC adjusts IC design layout diagram 622. In some embodiments, mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 632 includes a mask rule checker (MRC) that checks the IC design layout diagram 622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 622 to compensate for limitations during mask fabrication 644, which may undo part of the modifications performed by OPC in order to meet mask creation rules.

In some embodiments, mask data preparation 632 includes lithography process checking (LPC) that simulates processing that will be implemented by IC fab 650 to fabricate IC device 660. LPC simulates this processing based on IC design layout diagram 622 to create a simulated manufactured device, such as IC device 660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 622.

It should be understood that the description of mask data preparation 632 has been simplified for the purposes of clarity. In some embodiments, data preparation 632 includes additional features such as a logic operation (LOP) to modify the IC design layout diagram 622 according to manufacturing rules. Additionally, the processes applied to IC design layout diagram 622 during data preparation 632 may be executed in a variety of different orders.

After mask data preparation 632 and during mask fabrication 644, a mask 645 or a group of masks 645 are fabricated based on the modified IC design layout diagram 622. In some embodiments, mask fabrication 644 includes performing one or more lithographic exposures based on IC design layout diagram 622. In some embodiments, an electron-beam (e-beam) or a mechanism of multiple e-beams is used to form a pattern on a mask (photomask or reticle) 645 based on the modified IC design layout diagram 622. Mask 645 can be formed in various technologies. In some embodiments, mask 645 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 645 includes a transparent substrate (e.g., fused quartz) and an opaque material (e.g., chromium) coated in the opaque regions of the binary mask. In another example, mask 645 is formed using a phase shift technology. In a phase shift mask (PSM) version of mask 645, various features in the pattern formed on the phase shift mask are configured to have proper phase difference to enhance the resolution and imaging quality. In various examples, the phase shift mask can be attenuated PSM or alternating PSM. The mask(s) generated by mask fabrication 644 is used in a variety of processes. For example, such a mask(s) is used in an ion implantation process to form various doped regions in semiconductor wafer 653, in an etching process to form various etching regions in semiconductor wafer 653, and/or in other suitable processes.

IC fab 650 is an IC fabrication business that includes one or more manufacturing facilities for the fabrication of a variety of different IC products. In some embodiments, IC Fab 650 is a semiconductor foundry. For example, there may be a manufacturing facility for the front-end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 650 includes wafer fabrication tools 652 configured to execute various manufacturing operations on semiconductor wafer 653 such that IC device 660 is fabricated in accordance with the mask(s), e.g., mask 645. In various embodiments, fabrication tools 652 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 650 uses mask(s) 645 fabricated by mask house 630 to fabricate IC device 660. Thus, IC fab 650 at least indirectly uses IC design layout diagram 622 to fabricate IC device 660. In some embodiments, semiconductor wafer 653 is fabricated by IC fab 650 using mask(s) 645 to form IC device 660. In some embodiments, the IC fabrication includes performing one or more lithographic exposures based at least indirectly on IC design layout diagram 622. Semiconductor wafer 653 includes a silicon substrate or other proper substrate having material layers formed thereon. Semiconductor wafer 653 further includes one or more of various doped regions, dielectric features, multi-level interconnects, and the like (formed at subsequent manufacturing steps).

Some embodiments of the present disclosure provide a semiconductor structure. The semiconductor structure comprises a first semiconductor device, a second semiconductor device spaced apart from the first semiconductor device, and a first semiconductor component (boundary header cell 11) disposed in a channel region defined by the first semiconductor device and the second semiconductor device. The first semiconductor component is configured to control states of a plurality of components in the channel region. The first semiconductor device and the first semiconductor component are located adjacent to a boundary, and the first semiconductor component is electrically isolated from the first semiconductor device.

Some embodiments of the present disclosure provide a semiconductor structure. The semiconductor structure comprises a semiconductor device, at least one component spaced apart from the semiconductor device, a first semiconductor component adjacent to a boundary of the semiconductor device, and a second semiconductor component between the at least one component and the first semiconductor component. The semiconductor device and the at least one component define a channel region. The first semiconductor component is configured to control the at least one component. The second semiconductor component is configured to provide power to the first semiconductor component. The at least one component, the first semiconductor component, and the second semiconductor component are disposed in the channel region, and the first semiconductor component is electrically isolated from the semiconductor device.

Some embodiments of the present disclosure provide a method for manufacturing a semiconductor structure. The method comprises forming a substrate; forming a first semiconductor device and a second semiconductor device in the substrate, the first semiconductor device and the second semiconductor device defining a channel region; forming a first semiconductor component in the channel region, the first semiconductor component being located at a boundary of the first semiconductor device and electrically disconnected from the first semiconductor device; forming a second semiconductor component and a plurality of components in the channel region; and forming at least one boundary component in the channel region, the at least one boundary component being located adjacent to the boundary of the first semiconductor device, wherein states of the plurality of components are controlled by the first semiconductor component.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first semiconductor device;
    a second semiconductor device spaced apart from the first semiconductor device, the first semiconductor device and the second semiconductor device defining a channel region; and
    a first semiconductor component disposed in the channel region and configured to control states of a plurality of components in the channel region, wherein the first semiconductor component includes an n-doped region, a p-doped region, and a n-tap adjacent to the p-doped region, wherein the p-doped region and the n-tap are disposed in the n-doped region,
    wherein the first semiconductor device and the first semiconductor component are located adjacent to a boundary, and the first semiconductor component is electrically isolated from the first semiconductor device,
    wherein the n-doped region of the first semiconductor component is an n-type well, and the first semiconductor component includes a p-type well, and the n-tap is located between the p-doped region and the p-type well.

2. The semiconductor structure of claim 1, wherein the first semiconductor component is configured to activate or deactivate each of the plurality of components.

3. The semiconductor structure of claim 1, further comprising a second semiconductor component adjacent to the second semiconductor device and electrically connected to the first semiconductor component, wherein the second semiconductor component is disposed in the channel region.

4. The semiconductor structure of claim 1, further comprising at least one boundary component disposed adjacent to the first semiconductor device, wherein the first semiconductor component is sandwiched by two boundary components.

5. The semiconductor structure of claim 4, wherein the at least one boundary component includes a dummy oxide diffusion structure.

6. The semiconductor structure of claim 3, wherein the second semiconductor component includes a first n-doped region, a second n-doped region, a first p-doped region, a second p-doped region, and a p-tap surrounded by the first n-doped region, the second n-doped region, the first p-doped region, and the second p-doped region, and wherein the first p-doped region and the second p-doped region form a p-type well and the p-tap is disposed within the p-type well.

7. The semiconductor structure of claim 6, wherein the second semiconductor component is electrically connected to the first semiconductor component.

8. The semiconductor structure of claim 7, wherein the p-tap of the second semiconductor component is configured to provide power to the p-doped region of the first semiconductor component.

9. The semiconductor structure of claim 3, wherein the second semiconductor component is spaced apart from the first semiconductor component.

10. The semiconductor structure of claim 1, wherein the n-tap of the first semiconductor component is configured to provide power to the plurality of components in the channel region.

11. The semiconductor structure of claim 3, further comprising a boundary component disposed between the second semiconductor component and the second semiconductor device.

12. The semiconductor structure of claim 1, wherein the first semiconductor component further includes an oxide diffusion region located at the boundary.

13. The semiconductor structure of claim 1, wherein the first and second semiconductor device is selected from a group consisting of: a SRAM, a DRAM, and an ASIC.

14. A semiconductor structure, comprising:
    a semiconductor device;
    at least one component spaced apart from the semiconductor device, the semiconductor device and the at least one component defining a channel region;
    a first semiconductor component adjacent to a boundary of the semiconductor device and configured to control the at least one component, wherein the first semiconductor component includes an n-doped region, a p-doped region, and a n-tap adjacent to the p-doped region, wherein the p-doped region and the n-tap are disposed in the n-doped region; and
    a second semiconductor component between the at least one component and the first semiconductor component and providing power to the first semiconductor component,
    wherein the at least one component, the first semiconductor component, and the second semiconductor component are disposed in the channel region, and the first semiconductor component is electrically isolated from the semiconductor device,
    wherein the n-doped region of the first semiconductor component is an n-type well, and the first semiconductor component includes a p-type well, and the n-tap is located between the p-doped region and the p-type well.

15. The semiconductor structure of claim 14, wherein the first semiconductor component is configured to activate or deactivate the at least one component.

16. The semiconductor structure of claim 14, wherein the first semiconductor component further includes an oxide diffusion region located at the boundary.

17. The semiconductor structure of claim 14, wherein the at least one component is selected from a group consisting of: an AND gate component, an OR gate component, an NOT gate component, an NAND gate component, an NOR gate component, and an XOR gate component.

18. A method for manufacturing a semiconductor structure, comprising:
    forming a substrate;
    forming a first semiconductor device and a second semiconductor device in the substrate, the first semiconductor device and the second semiconductor device defining a channel region;
    forming a first semiconductor component in the channel region, the first semiconductor component being located at a boundary of the first semiconductor device and electrically disconnected from the first semiconductor device, wherein the first semiconductor component includes an n-doped region, a p-doped region, and a n-tap adjacent to the p-doped region, wherein the p-doped region and the n-tap are disposed in the n-doped region, wherein the n-doped region of the first semiconductor component is an n-type well, and the first semiconductor component includes a p-type well, and the n-tap is located between the p-doped region and the p-type well;
    forming a second semiconductor component and a plurality of components in the channel region; and
    forming at least one boundary component in the channel region, the at least one boundary component being located adjacent to the boundary of the first semiconductor device,
    wherein states of the plurality of components are controlled by the first semiconductor component.

19. The method of claim 18, wherein the first semiconductor component is configured to activate or deactivate each of the plurality of components, and wherein the first semiconductor component is configured to provide power to the substrate and be electrically isolated from the first semiconductor device.

20. The semiconductor structure of claim 14, wherein the semiconductor device is selected from a group consisting of: a SRAM, a DRAM, and an ASIC.

\* \* \* \* \*